United States Patent
Tanaka

(10) Patent No.: US 6,840,056 B2
(45) Date of Patent: Jan. 11, 2005

(54) COOLING SYSTEM WITH ADSORPTION REFRIGERATOR

(75) Inventor: Masaaki Tanaka, Nagoya (JP)

(73) Assignee: Denso Corporation, Kariya (JP)

( * ) Notice: Subject to any disclaimer, the term of this patent is extended or adjusted under 35 U.S.C. 154(b) by 0 days.

(21) Appl. No.: 10/615,079

(22) Filed: Jul. 8, 2003

(65) Prior Publication Data

US 2004/0007011 A1 Jan. 15, 2004

(30) Foreign Application Priority Data

Jul. 9, 2002 (JP) ........................................ 2002-199996

(51) Int. Cl.[7] ............................................... F25B 27/00
(52) U.S. Cl. ........................... 62/238.3; 62/3.2; 62/476; 165/62
(58) Field of Search .......................... 62/3.2, 3.3, 238.3, 62/259.2, 475, 476; 165/104.33, 62; 361/689

(56) References Cited

U.S. PATENT DOCUMENTS 4,742,868 A * 5/1988 Mitani et al. .......... 165/104.12
5,245,839 A * 9/1993 Chang et al. ................. 62/292
6,360,559 B1 * 3/2002 Midorikawa ................. 62/475
2002/0092315 A1   7/2002 Tanaka et al.

FOREIGN PATENT DOCUMENTS

JP          405288444 A   * 11/1993
JP          2002295925 A  * 10/2002

* cited by examiner

Primary Examiner—Melvin Jones
(74) Attorney, Agent, or Firm—Harness, Dickey & Pierce PLC

(57) ABSTRACT

In a cooling system for cooling first and second heat-generating members, the first heat-generating member is cooled by a refrigerator, and cold produced by the refrigerator is stored in a cold storage unit, so that both the first and second heat-generating members can be continuously cooled by only using a single adsorption unit. Therefore, production cost of the cooling system can be reduced. Further, because the second heat-generating member is cooled through the cold storage unit, a temperature change in the adsorption unit immediately after a switching between an adsorbing mode and a desorbing mode can be absorbed in the cold storage unit. Accordingly, the heat-generating members can be stably cooled while the component number of the cooling system can be decreased.

18 Claims, 11 Drawing Sheets

FIG. 9 DIRECT COOLING MODE

COOLING SYSTEM WITH ADSORPTION REFRIGERATOR

CROSS REFERENCE TO RELATED APPLICATION

This application is based on Japanese Patent Application No. 2002-199996 filed on Jul. 9, 2002, the disclosure of which is incorporated herein by reference.

BACKGROUND OF THE INVENTION

1. Field of the Invention

The present invention relates to a cooling system with an adsorption refrigerator for cooling plural heat-generating members. The cooling system is effectively used for cooling an electronic unit provided in a base station of a portable phone, an electric equipment, an electric converter, a battery or the like.

2. Related Art

In a cooling system with an adsorption refrigerator, a cooling capacity can be obtained in an adsorbing mode where refrigerant is adsorbed to an adsorbent, but the cooling capacity cannot be obtained in a desorbing mode where the adsorbed refrigerant is removed from the adsorbent. Therefore, generally, adsorption units equal to more than two are provided. Specifically, one adsorption unit is used in the adsorbing mode so that the cooling capacity is obtained, and another adsorption unit is used in the desorbing mode so that refrigerant is desorbed and regenerated. The adsorbing mode and the desorbing mode are alternately repeated, thereby continuously obtain the cooling capacity.

However, in this cooling system, immediately after the switching between the adsorbing mode and the desorbing mode, temperature of cooling water supplied from the adsorption refrigerator is largely changed, and a cooling object such as an electronic equipment may be affected due to the variation in the temperature of cooling water. Further, because the adsorption units equal to or more than two are used in order to continuously obtain the cooling capacity, it is difficult to reduce manufacturing cost of the cooling system.

SUMMARY OF THE INVENTION

In view of the above-described problems, it is an object of the present invention to provide a cooling system with a new system structure.

It is another object of the present invention to provide a cooling system which effectively reduce the number of components while a stable cooling can be supplied to a heat-generating member that is an object body to be cooled.

According to the present invention, a cooling system for cooling at least first and second heat-generating members includes a refrigerator that is disposed to absorb heat from the first and second heat-generating members and is operated using the absorbed heat, and a cold storage unit for storing cold produced in the refrigerator. Therefore, the first heat-generating member can be cooled by the refrigerator, and the second heat-generating member can be cooled by using cold stored in the cold storage unit. Accordingly, it is possible to continuously cool the second heat-generating member by using a single adsorption unit of the refrigerator, thereby reducing product cost of the cooling system. Because the second heat-generating member is cooled through the cold storage unit, the cold storage unit can absorb a variation in a cooling temperature, and a bad influence to the second heat-generating member can be restricted. Accordingly, the number of components of the cooling system can be reduced while the first and second heat-generating members are stably cooled.

Generally, the refrigerator includes an adsorption unit having an adsorbent for adsorbing gas refrigerant, and the refrigerant adsorbed in the adsorbent is removed from the adsorbent when being heated. Further, the adsorption unit is disposed to alternately repeat an adsorbing mode where the adsorbent adsorbs gas refrigerant to obtain cooling capacity, and a desorbing mode where the adsorbed refrigerant is removed from the adsorbent. In the cooling system, the cold storage unit is disposed to cool the second heat-generating member in both the adsorbing mode and the desorbing mode. In this case, the temperature variation in the cooling temperature of the second heat-generating member can be further reduced.

Preferably, in the adsorbing mode, liquid refrigerant in the adsorption unit is supplied to the cold storage unit, and the cold storage unit stores the cold by liquid refrigerant supplied from the adsorption unit. Therefore, the cold can be readily stored in the cold storage unit. Further, a condenser is disposed in the adsorption unit for cooling and condensing refrigerant removed from the adsorbent in the desorbing mode. In this case, the liquid refrigerant within the adsorption unit can be supplied to the cold storage unit for a predetermined time after a start of the desorbing mode so that a liquid surface in the adsorption unit is decreased. More preferably, the condenser is disposed at a position higher than a liquid surface in the adsorption unit.

In addition, first and second tanks are disposed to store a fluid through which heat absorbed from the first heat-generating member supplies to the refrigerator. In this case, the first and second tanks are arranged such that the fluid before being heated in the first heat-generating member is stored in the first tank, and the fluid after being heated in the first heat-generating member is stored in the second tank. Further, in a fluid circulation mode, a flow amount of the fluid supplied from the second tank to the refrigerator is made larger than that of the fluid supplied from the first tank to the first heat-generating member. For example, at least in the desorbing mode, the fluid circulating mode is performed.

More preferably, the cooling system is provided with a facilitating member for facilitating heat exchange between the fluid in the second tank and air. In this case, even when the refrigerator is damaged, the first heat-generating member can be cooled.

BRIEF DESCRIPTION OF THE DRAWINGS

Other objects, features and advantages of the present invention will become more apparent from the following detailed description made with reference to the accompanying drawings, in which.

DETAILED DESCRIPTION OF THE PREFERRED EMBODIMENTS

Figure 1:
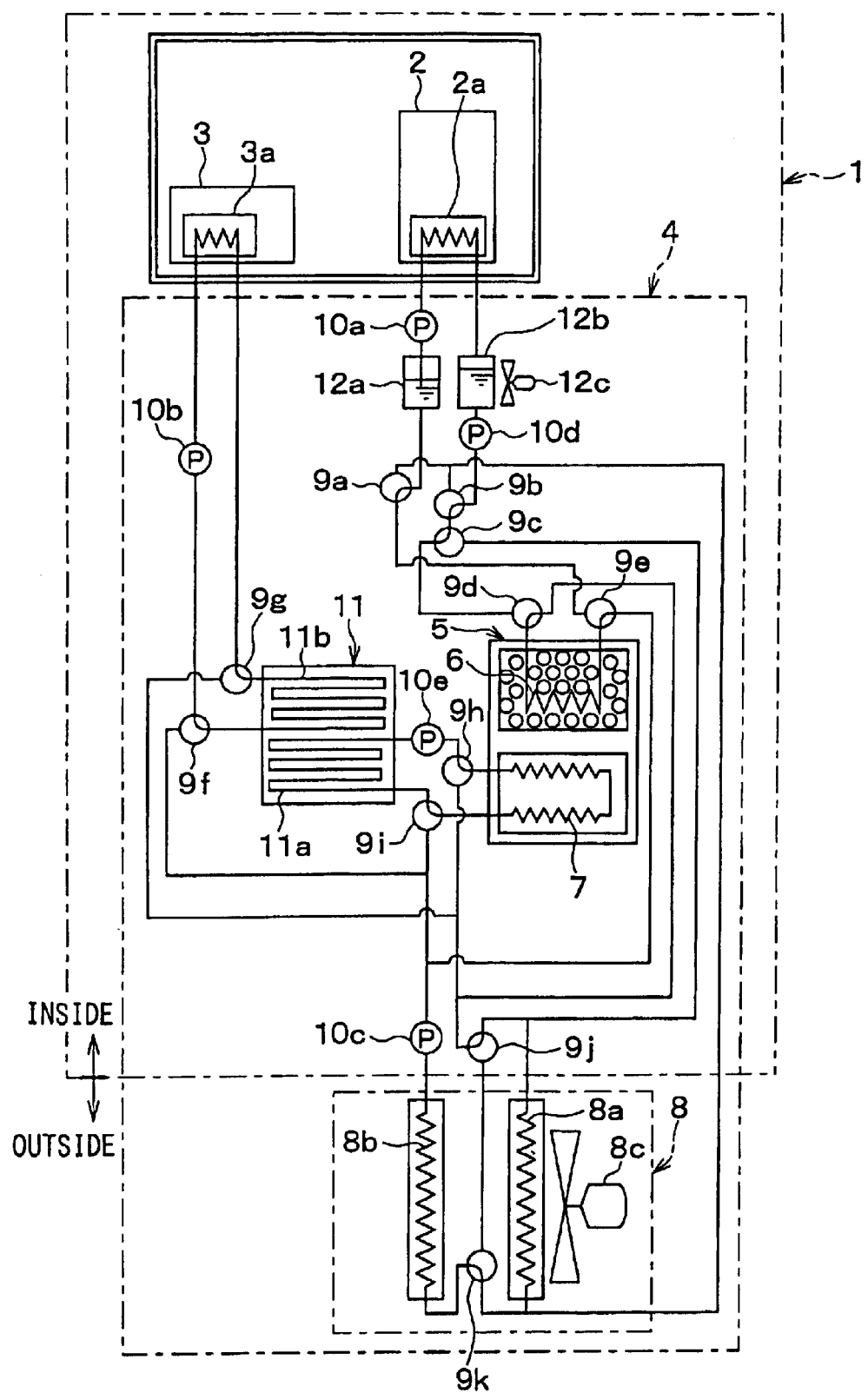
FIG. 1 is a schematic diagram showing a cooling system according to a first embodiment of the present invention.

A first embodiment of the present invention will be now described with reference to FIGS. 1–5. In the first embodiment, a cooling system is typically used for cooling electronic equipments in a base station 1 for portable phone. As shown in FIG. 1, within the base station 1, a first heat-generating member 2, a second heat-generating member 3 and a cooling device 4 (adsorption refrigerator) for cooling the first and second heat-generating members 2, 3 are provided. For example, the first heat-generating member 2 includes a radio wave amplifier, a radio wave control board, a commutator, an electronic equipment, an electric equipment and an electric converter that have a relatively large heat-generating amount and a relatively high temperature when being operated. The second heat-generating member 3 is need to be cooled in a temperature lower than the first heat-generating member 2. For example, the second heat-generating member 3 includes a circuit control board, a battery, an electronic equipment and an electric converter that have a relatively small heat-generating amount when being operated.

Generally, both the first and second heat-generating members 2, 3 are not operated independently, but are operatively linked with each other. The cooling device 4 is an adsorption refrigerator that absorbs heat from the first heat-generating member 2, and heats an adsorbent by the absorbed heat.

Next, the cooling device 4 will be now described. In the figures, the cooling device is indicated to include a cold storage unit 11. However, actually, cold produced from the cooling device is stored in the cold storage unit 11. The adsorbent of the adsorption core 6 adsorbs a refrigerant (e.g., water in the first embodiment), and desorbs (removes) the adsorbed refrigerant when being heated. For example, in the first embodiment, a solid adsorbent such as a silica gel and a zeolite is used as the adsorbent. The adsorption unit 5 includes a container for sealing therein the refrigerant in a vacuum state, the adsorption core 6 for performing heat exchange between the adsorbent and the thermal medium, and the evaporation/condensation core 7 for performing heat exchange between the thermal medium and the refrigerant sealed in the container. In the first embodiment, the thermal medium is a water solution mixed with an antifreezing fluid of an ethylene glycol type. The adsorbent is closely adhered to a surface of the adsorbent core 6. The adsorbent core 6 is disposed above the evaporation/condensation core 7 in the adsorption unit 5, in the first embodiment.

An exterior heat exchanger 8 is a radiator, which is disposed outside the base station to perform heat exchange between the thermal medium and outside air. The exterior heat exchanger 8 includes a first heat radiation portion 8a, a second heat radiation portion 8b, and a fan 8c for blowing outside air to the first and second heat radiation portions 8a, 8b. The first heat radiation portion 8a is disposed upstream from the second heat radiation portion 8b in a flow direction of air.

A first heat collection portion 2a is disposed to collect heat generated in the first heat-generating member 2, and to perform heat exchange between the collected heat and the thermal medium. A second heat collection portion 3a is disposed to collect heat generated in the second heat-generating member 3, and to perform heat exchange between the collected heat and the thermal medium. Rotary valves 9a–9k for switching a flow of the thermal medium are provided. Further, pumps 10a–10e are disposed to circulate the thermal medium in a thermal medium passage.

A cold storage unit 11 is disposed to store cold generated in the cooling device 4. In the cold storage unit 11 a fluid having a relative large specific heat, such as polyethylene glycol, caprylic acid, tetradecane and water, is used as a cold storage material. The cold storage unit 11 includes a first heat exchanger 11a in which the thermal medium circulated in the evaporation/condensation core 7 is heat-exchanged with the cold storage material, and a second heat exchanger 11b in which the thermal medium circulated in the second heat collection portion 3a is heat-exchanged with the cold storage material. In the first embodiment, the first heat-exchanging unit 11a is disposed above the second heat-exchanging unit 11b in the cold storage unit 11.

A first reserve tank 12a is disposed for storing the thermal medium before being heated in the first heat-generating member 2, and a second reserve tank 12b is disposed for storing the thermal medium after being heated in the first heat-generating member 2. Further, a blower 12c is disposed to blow cooling air toward the outer surface of the second reserve tank 12b. Because the cooling air is blown toward the outer surface of the second reserve tank 12b, heat exchange between the thermal medium in the second reserve tank 12b and air can be improved.

Next, operation of the cooling system according to the first embodiment of the present invention will be now described.

In the first embodiment, the cooling device 4 operates in an operation mode such as a base operation mode, a direct cooling mode and a trouble operation mode. First, the base operation mode will be now described. The base operation mode is a normal mode, and includes first and second base operation modes. The first and second base operation modes are switched by a predetermined time. Here, the predetermined time is determined based on a time necessary for removing the refrigerant adsorbed in the adsorbent from the adsorbent.

In the first embodiment, the first heat-generating member 2 is cooled to become equal to or lower than 150° C., and the second heat-generating member 3 is cooled to become equal to or lower than a predetermined temperature (e.g., 55–60° C.). Further, the cooling device 4 provides a predetermined cooling capacity corresponding to a temperature range between 70° C.–100° C.

In order to stably operate the cooling device 4, the heat-generating amount of the second heat-generating member 3 needs to be equal to or lower than that of the first heat-generating member 3.

(1) First Base Operation Mode (Adsorbing Mode)

Figure 2:
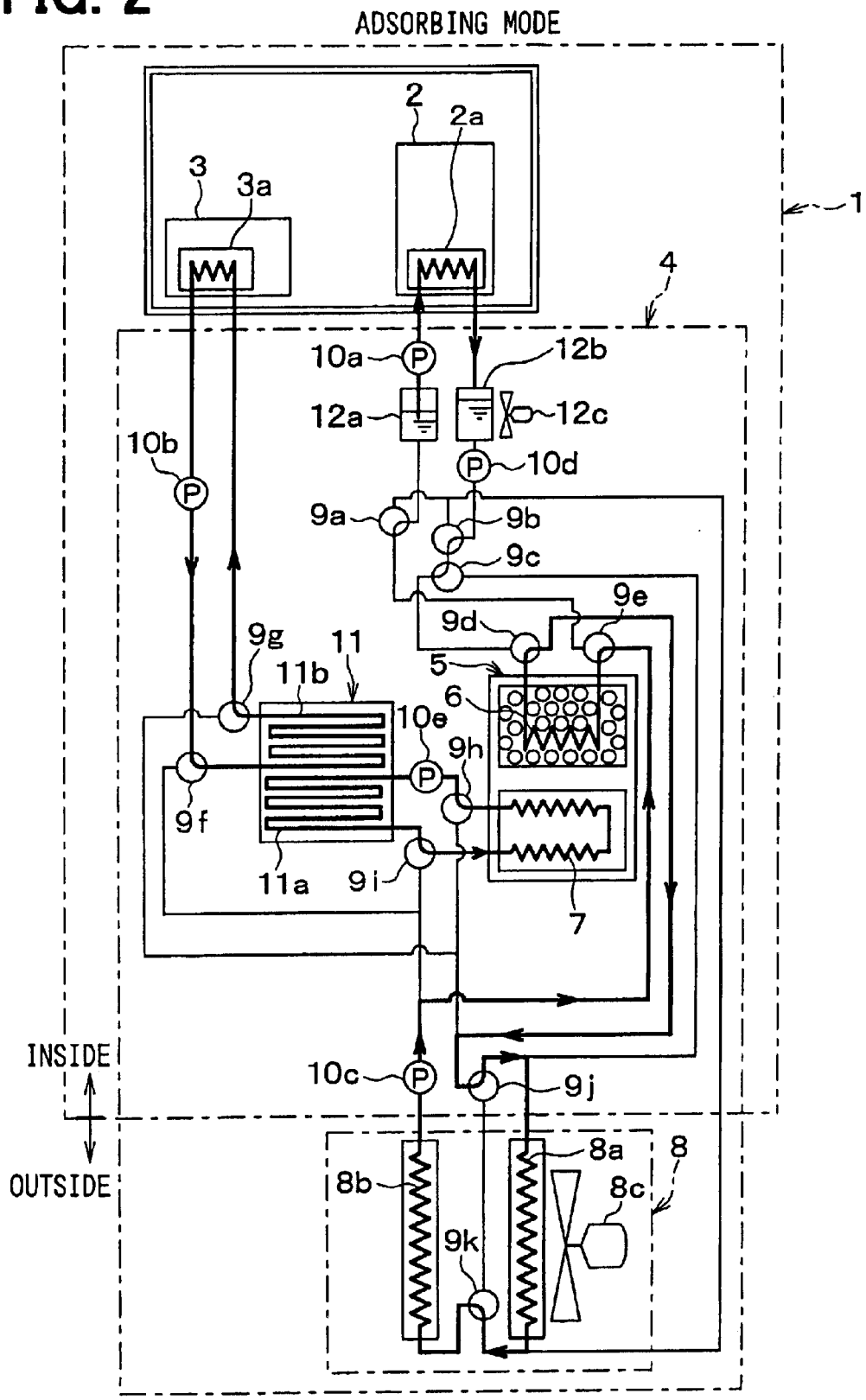
FIG. 2 is a schematic diagram showing a thermal medium flow in a first basis operation mode (adsorbing mode) according to the first embodiment.

In the first base operation mode (adsorbing mode), as shown in FIG. 2, the thermal medium circulates between the second heat collection portion 3a and the second heat exchanger 11b of the cold storage unit 11, so that the second heat-generating member 3 is cooled by the cold stored in the cold storage unit 11. At the same time, the thermal medium circulates between the first heat exchanger 11a of the cold storage unit 11 and the evaporation/condensation core 7 of the adsorption unit 5. Accordingly, liquid refrigerant in the evaporation/condensation core 7 of the adsorption unit 5 absorbs heat from the thermal medium flowing out from the first heat exchanger 11a, and is evaporated. Because the evaporated gas refrigerant is adsorbed on the adsorbent of the adsorption core 6, the pressure increase in the adsorption unit 5 is restricted, and the evaporation of the liquid refrigerant is continued to produce cold, until the refrigerant adsorption of the adsorbent is finished. The produced cold is stored in the cold storage material of the cold storage unit 11, and is used for cooling the second heat-generating member 3.

When the adsorbent of the adsorption core 6 adsorbs the gas refrigerant, a heat quantity corresponding to the condensation heat is generated. Further, as the temperature of the adsorbent increases, the amount of the gas refrigerant capable of being adsorbed on the adsorbent is reduced, and the adsorption capacity is decreased. Accordingly, in the adsorbing mode, the thermal medium cooled in the exterior heat exchanger 8 is supplied to the adsorption core 6, so that the adsorbent is cooled.

In the adsorbing mode, the pump 10a is operated while the pump 10d stops. Therefore, in this case, exhaust heat from the first heat-generating member 2 is recovered, and the recovered heat from the first heat-generating member 2 is stored in the second reserve tank 12b. That is, the thermal medium heated in the first heat-generating member is stored in the second reserve tank 12b.

Accordingly, in the first base operation mode, the exhaust heat generated in the first heat-generating member 2 is stored in the second reserve tank 12b, for the next second base operation mode.

(2) Second Base Operation Mode (Desorbing Mode)

Figure 3:
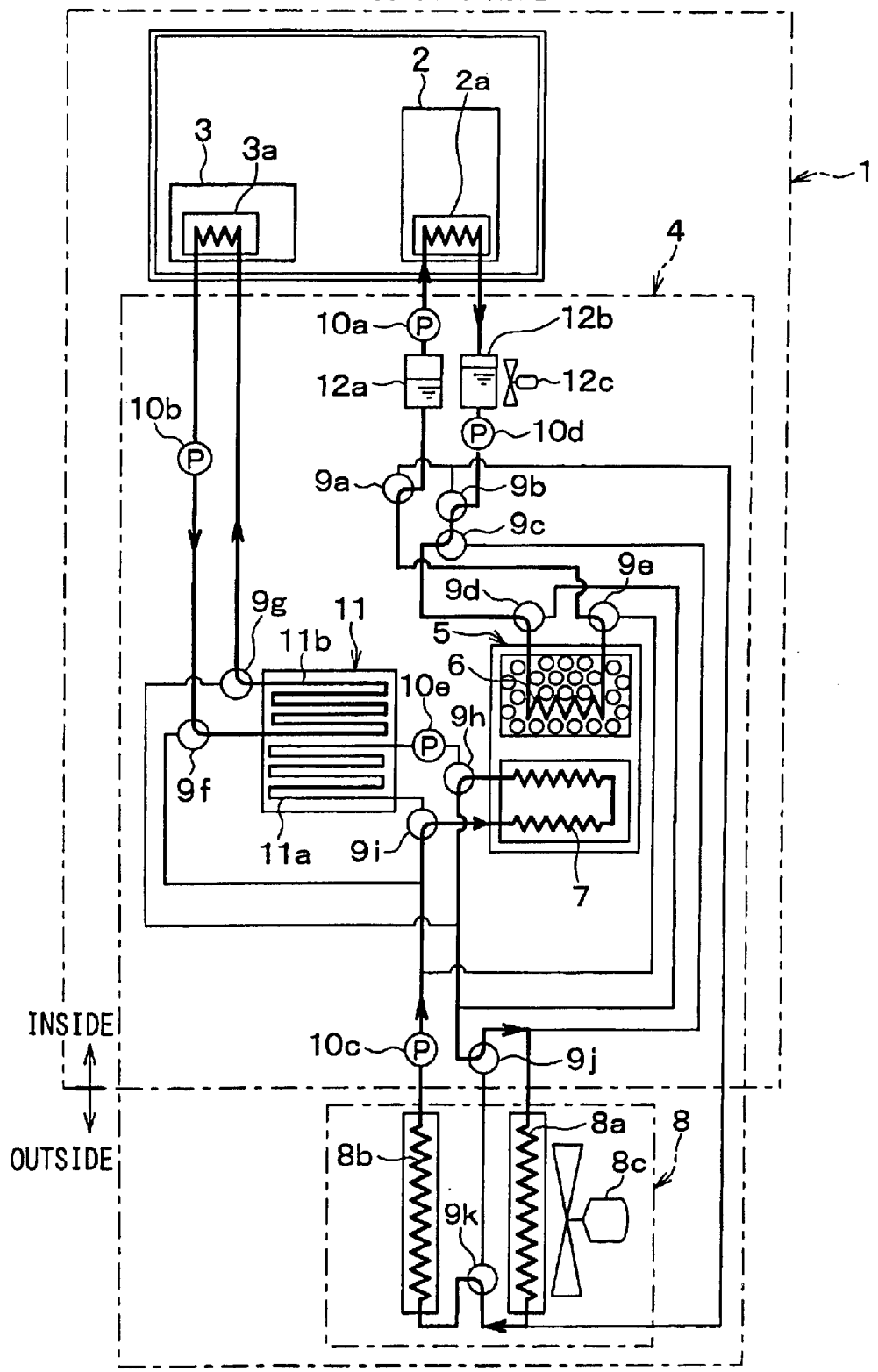
FIG. 3 is a schematic diagram showing a thermal medium flow in a second basis operation mode (desorbing mode) according to the first embodiment.

In the desorbing mode, as shown in FIG. 3, the thermal medium circulates between the second heat collection portion 3a and the second heat exchanger 11b of the cold storage unit 11, so that the second heat-generating member 3 is cooled by the cold stored in the cold storage unit 11. At the same time, the thermal medium is circulated between the first heat collection portion 2a and the adsorption core 6, so that exhaust heat from the first heat-generating member 2, recovered in the first heat collection portion 2a, is supplied to the adsorbent, and the refrigerant adsorbed in the adsorbent is removed from the adsorbent. Further, the thermal medium cooled in the exterior heat exchanger 8 is supplied to the evaporation/condensation core 7, so that the gas refrigerant desorbed from the adsorbent of the adsorption core 6 is cooled and condensed.

Further, in the desorbing mode, the amount of the thermal medium supplied to the adsorption core 6 is made larger than that the thermal medium flowing into the first heat collection portion 2a, so that the amount of the thermal medium within the second reserve tank 12b becomes substantially zero when the desorbing mode is finished.

(3) Direct Cooling Mode

The direct cooling mode is performed when the outside air temperature is extremely low in the winter, or when the outside air temperature is lower than a cooling temperature (i.e., permissible heat-resistance temperature of the second heat-generating member 3), or when the cooling device 4 has a trouble.

Figure 4:
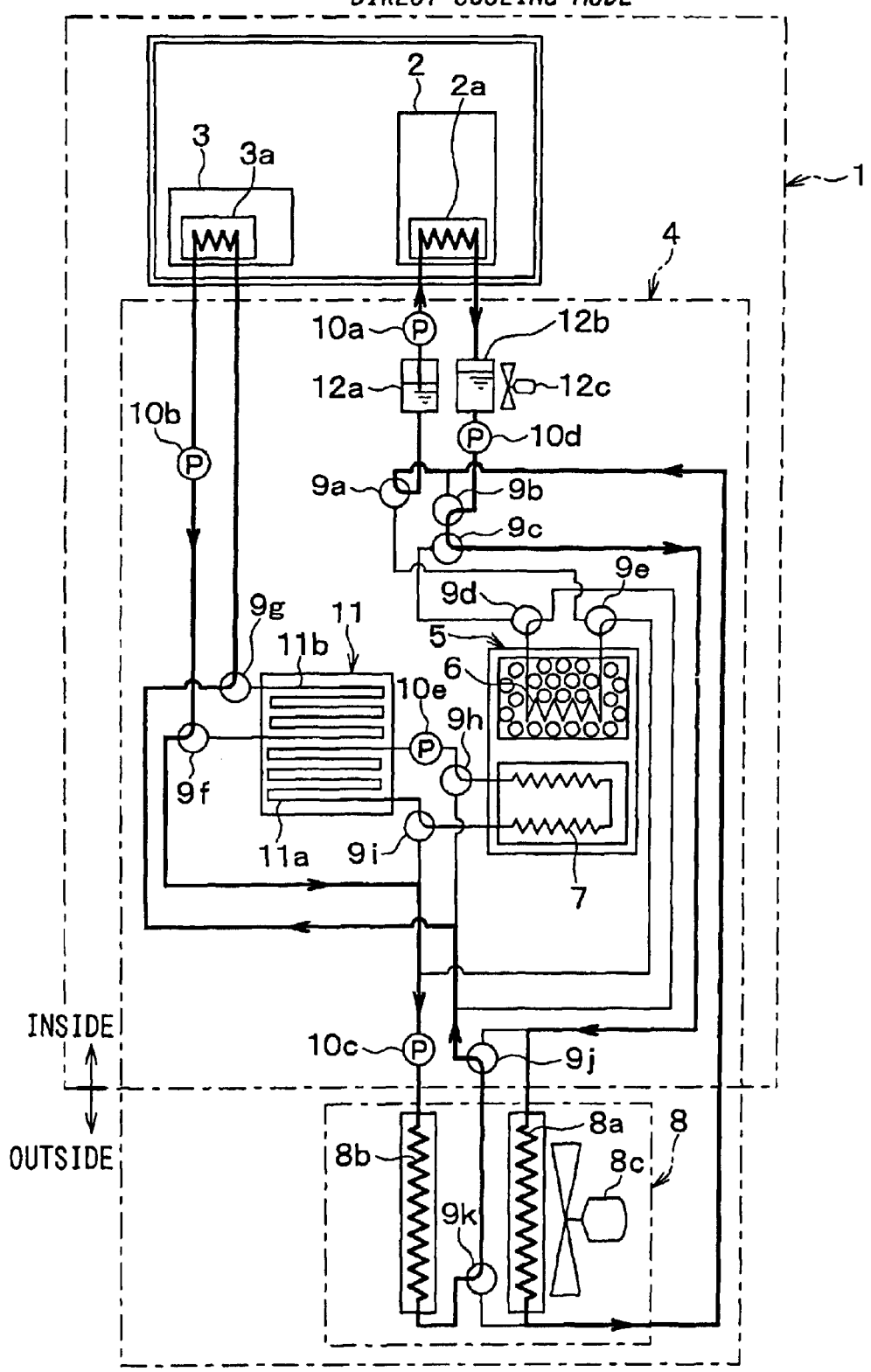
FIG. 4 is a schematic diagram showing a thermal medium flow in a direct cooling mode according to the first embodiment.

Specifically, as shown in FIG. 4, in the direct cooling mode, the thermal medium circulates between the first heat collection portion 2a of the first heat-generating member 2 and the first heat radiation portion 8a, and the thermal medium circulates between the second heat collection portion 3a of the second heat-generating member 3 and the second heat radiation portion 8b. Therefore, heat generated in the first and second heat-generating members 2, 3 is radiated to outside in the outside heat exchanger 8.

The outside air temperature is detected by an outside air temperature sensor, and the direct cooling mode is performed when the detected outside air temperature is equal to or lower than 15° C., for example.

The trouble of the cooling device 4 is determined when the pressure in the adsorption unit 5 becomes equal to or higher than a predetermined value (e.g., 70 KPa), or when the temperature of the thermal medium flowing from the evaporation/condensation core 7 becomes higher than a predetermined value (e.g., 20° C.) in the adsorbing mode (first base operation mode), or when the temperature of the thermal fluid flowing from the evaporation/condensation core 7 substantially becomes equal to the temperature of the thermal medium in the inlet of the evaporation/condensation core 7, or when the temperature of the thermal medium flowing into the adsorption core 6 of the adsorption unit 5 substantially becomes equal to the temperature of the thermal medium flowing out from the adsorption core 6.

In the direct cooling mode, the flow direction of the thermal medium in the pump 10c is opposite to that in the base operation mode. Therefore, in the first embodiment, a bypass circuit through which the thermal medium bypasses the pump 10c can be provided. Alternatively, a pump capable to be operated normally or reversely can be used as the pump 10c.

(3) Trouble Operation Mode

Figure 5:
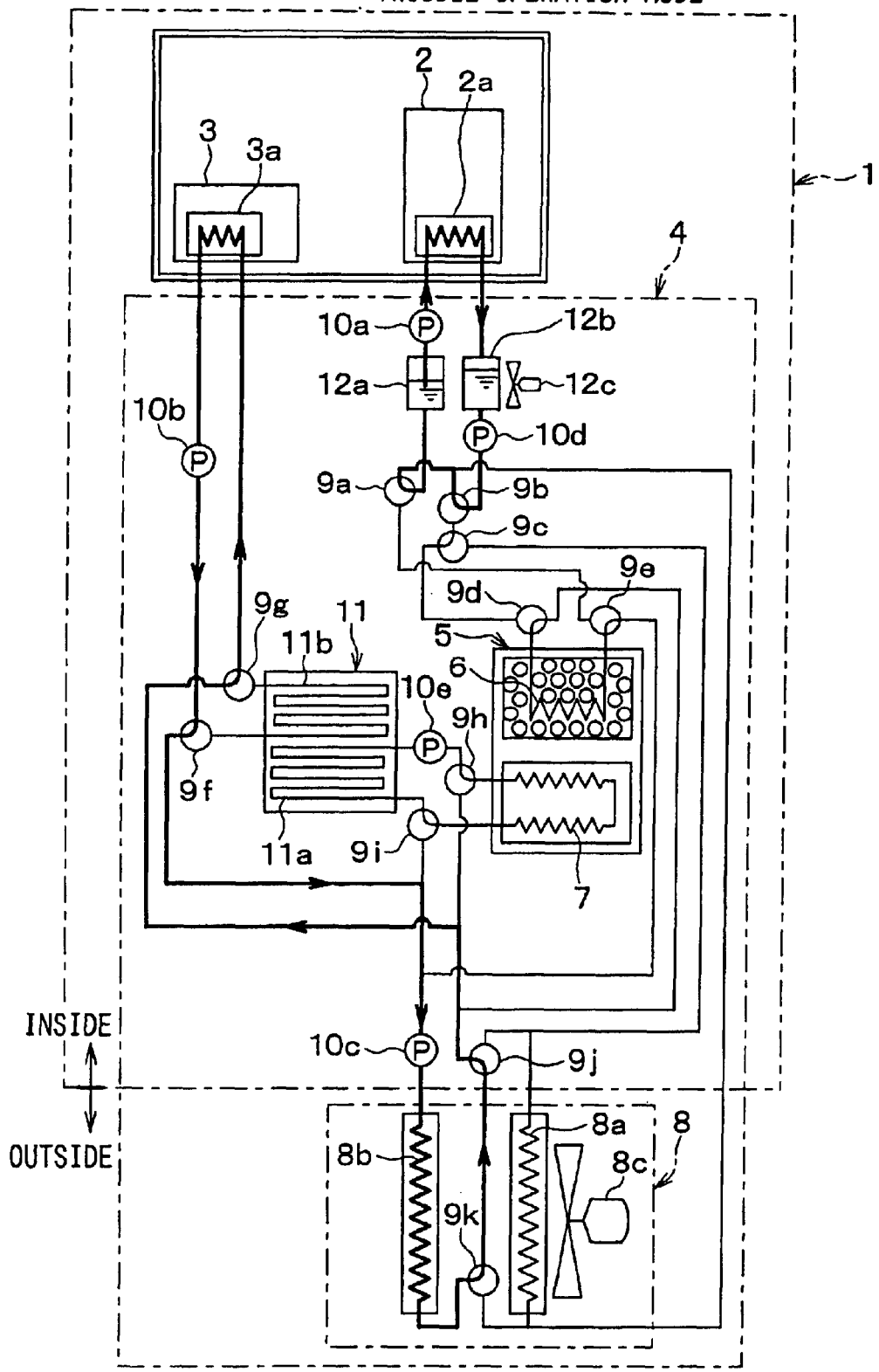
FIG. 5 is a schematic diagram showing a thermal medium flow in a trouble operation mode according to the first embodiment.

The trouble operation mode is performed, when the direct cooling mode cannot be performed while a trouble of the cooling device 4 causes. Specifically, as shown in FIG. 5, in the trouble operation mode, the blower 12c is operated, and the thermal medium is circulated between the first heat collection portion 2a of the first heat-generating member 2, the first reserve tank 12a and the second reserve tank 12b, so that the first heat-generating member 2 is cooled. At the same time, the thermal medium is circulated between the second heat collection portion 3a of the second heat-generating member 3 and the second heat radiation portion 8b of the exterior heat exchanger 8, so that the second heat-generating member 3 is cooled.

In the trouble operation mode, the thermal medium flows in the pump 10c reversely, as compared with the flow direction of the thermal medium in the first and second base operation modes. Therefore, the bypass circuit through which the thermal medium bypasses the pump 10c is provided, or the pump capable to be operated normally or reversely can be used as the pump 10c. Further, radiation fins may be provided in the first reserve tank 12a. In this case, heat radiation performance in the first reserve tank 12a can be effectively improved.

According to the first embodiment, the cold produced by the cooling device 4 is stored in the cold storage unit 11. Therefore, in the desorbing mode (i.e., second base operation mode), the second heat-generating member 3 can be cooled by using the cold stored in the cold storage unit 11, as described above. Thus, the second heat-generating member 3 can be continuously cooled by using the single adsorption unit 5, thereby reducing the product cost of the cooling system.

The present invention is for reducing the number of the adsorption units. Therefore, the single adsorption unit 5 can be used, and plural adsorption unit 5 having a reduced number can be also used. That is, the present invention is not limited to only the single adsorption unit 5.

Further, in the first embodiment of the present invention, the second heat-generating member 3 is cooled through the cold storage unit 11. Therefore, the cold storage unit 11 can absorb the variation in the temperature of the cooling fluid immediately after the switching between the adsorbing mode (i.e., first base operation mode) and the desorbing mode (i.e., second base operation mode). Accordingly, a large temperature change of a cooling object such as an electronic machine can be restricted, so that bad affection to the cooling object due to the temperature change can be restricted.

In the first embodiment, the second heat-generating member 3 is cooled by the cold stored in the cold storage unit 11 in both the adsorbing mode and the desorbing mode, the variation of the cooling temperature of the second heat-generating member 3 can be further restricted. Accordingly, the cold can be stably supplied to the heat generating body that is the cooling object, and the number of compartments for constructing the cooling system can be reduced.

Further, in the first embodiment of the present invention, because the exhaust heat generated in the first heat-generating member 2 is not consumed in the cooling device 4 in the adsorbing mode, the first heat-generating member 2 may be not cooled in the adsorbing mode. However, in the first embodiment, the thermal medium heated by the first heat-generating member 2 is stored in the second reserve tank 12*b*, the cooling of the first heat-generating member 2 can be continuously performed even when the exhaust heat generated in the first heat-generating member 2 is not consumed in the cooling device 4.

A second embodiment of the present invention will be now described with reference to FIGS. 7–10. In the above-described first embodiment of the present invention, the thermal medium is circulated between the evaporation/condensation core 7 and the first heat exchanger 11*a* of the cold storage unit 11, so that the cold storage material is cooled and the cold is stored in the cold storage unit 11. In this case, when the adsorption unit 5 operates in the adsorbing mode (i.e., the first base operation mode), the refrigerant within the adsorption unit 5 is in a saturation temperature corresponding to the inner pressure in the adsorption unit 5. Accordingly, in the second embodiment of the present invention, the cold storage material used only for the cold storage unit 11 is not provided. In the second embodiment, in the adsorbing mode, cooled liquid refrigerant is supplied from the adsorption unit 5 to the cold storage unit 11, so that the cold is stored in the cold storage unit 11.

Figure 6:
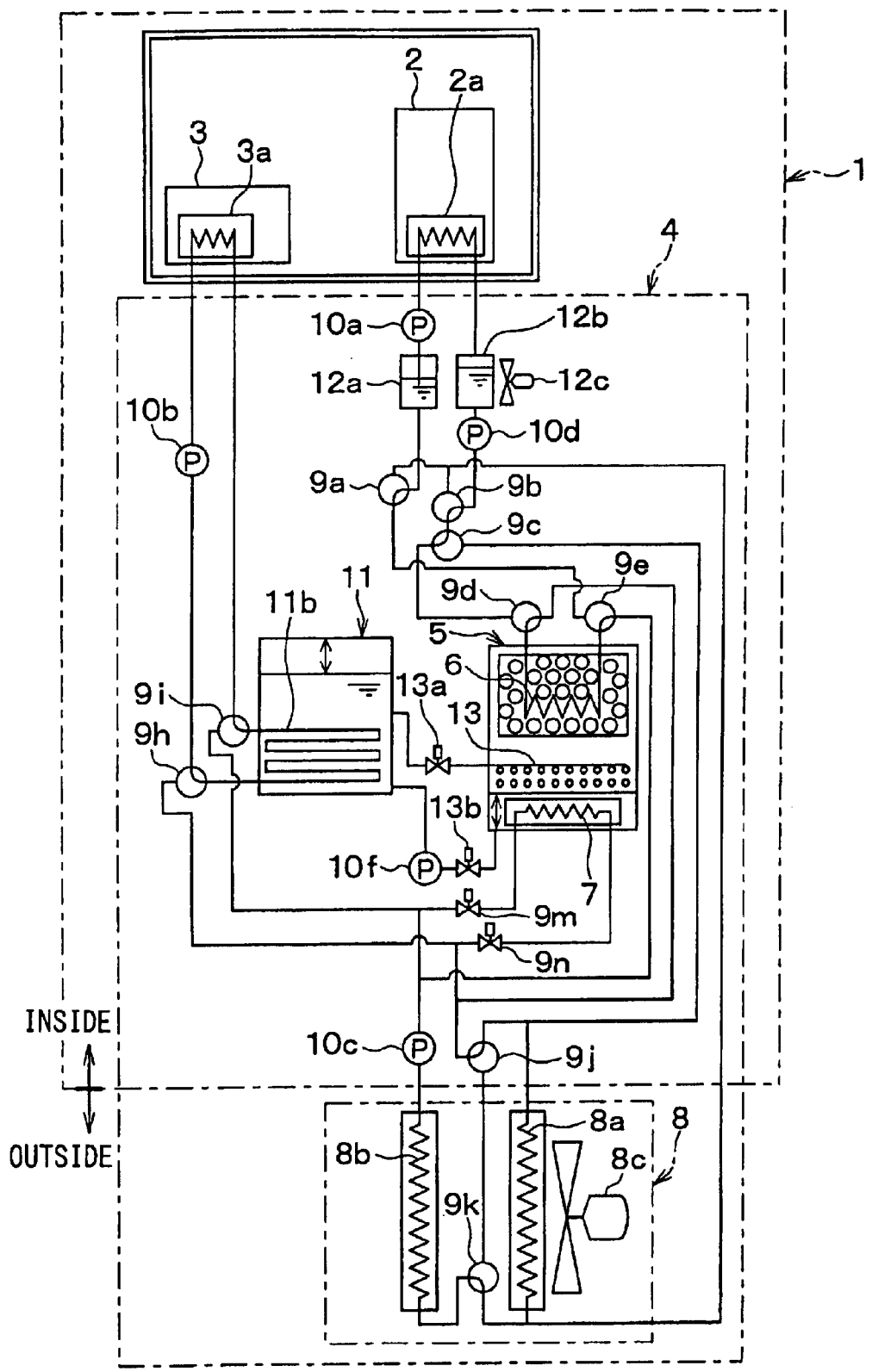
FIG. 6 is a schematic diagram showing a cooling system according to a second embodiment of the present invention.

Specifically, as shown in FIG. 6, a pump 10*f* for supplying the liquid refrigerant in the adsorption unit 5 to the cold storage unit 11 is provided, and nozzles for jetting the liquid refrigerant in the cold storage unit 11 into the adsorption unit 5 are provided. For example, the liquid refrigerant in the cold storage unit 11 is jetted in liquid drops to the adsorption unit 5 through the nozzles 13. The valves 13*a*, 13*b* are provided to control a refrigerant flow supplying to the nozzles 13, and the valves 9*m*, 9*n* are provided to control a thermal medium flow in the evaporation/condensation core 7.

Next, operation mode of the cooling system according to the second embodiment of the present invention will be now described.

(1) First Base Operation Mode (Adsorbing Mode)

Figure 7:
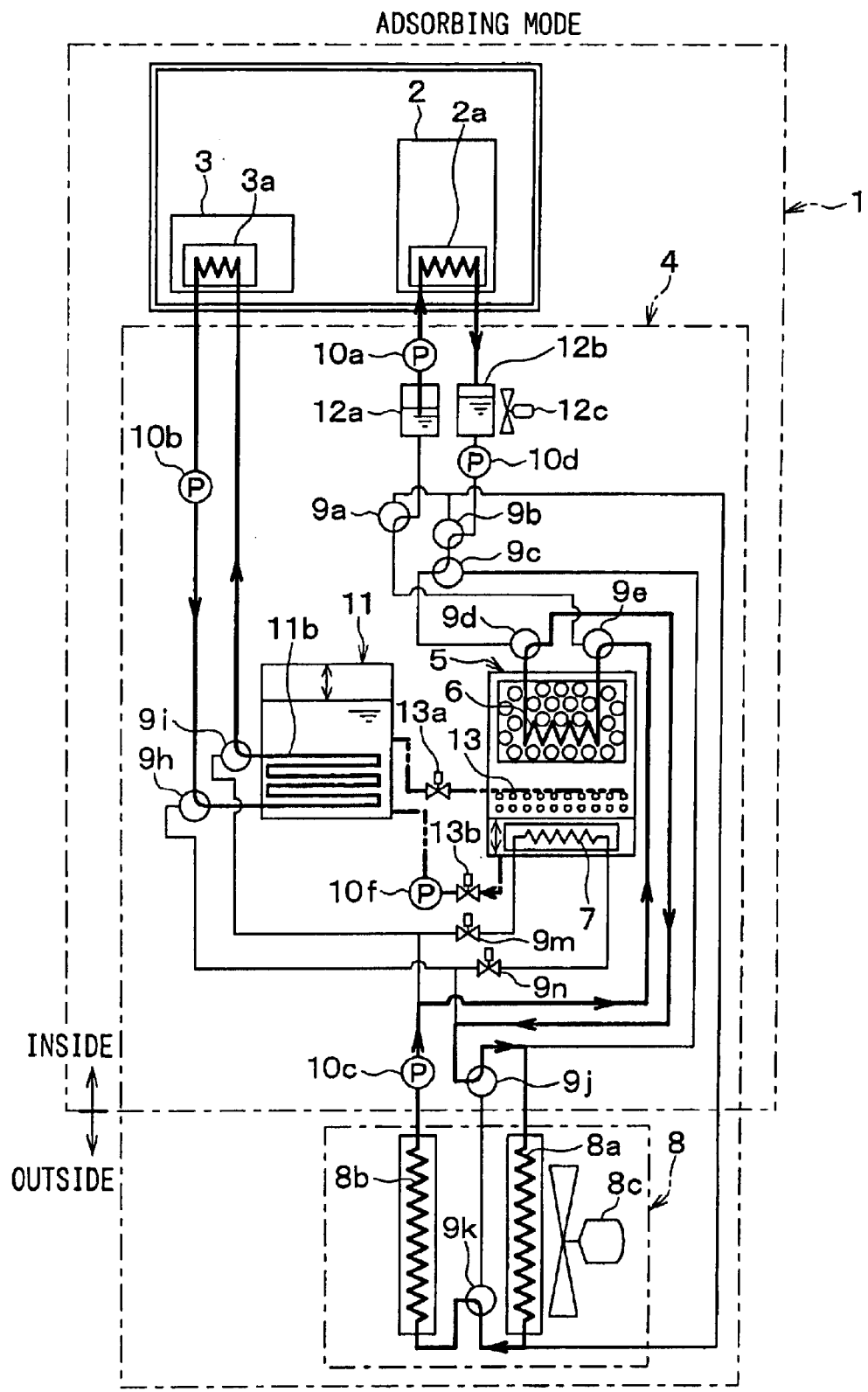
FIG. 7 is a schematic diagram showing a thermal medium flow in the first basis operation mode according to the second embodiment.

In the adsorbing mode, as shown in FIG. 7, the thermal medium is circulated between the second heat collection portion 3*a* of the second heat-generating member 3 and the second heat exchanger 11*b* of the cold storage unit 11. Therefore, the second heat-generating member 3 is cooled by using the cold stored in the cold storage unit 11, and liquid refrigerant in the cold storage unit 11 is jetted into the adsorption unit 5 while liquid refrigerant in the adsorption unit 5 is supplied to the cold storage unit 11. Accordingly, the refrigerant jetted while being fogged is evaporated by absorbing heat in the adsorption unit 5, and the evaporated gas refrigerant is adsorbed into the adsorbent. At this time, the refrigerant in the adsorption unit 5 becomes the saturation temperature corresponding to the inner pressure within the adsorption unit 5. Therefore, the temperature of the liquid refrigerant in the adsorption unit 5 decreases, and cold is produced. That is, the liquid refrigerant in the adsorption unit 5 is cooled, and the cooled liquid refrigerant is supplied to the cold storage unit 11 so that the cold is stored in the cold storage unit 11.

When the absorbent in the absorption unit 5 absorbs gas refrigerant, the heat quantity corresponding to the condensation heat generates, and the adsorbing capacity of the adsorbent decreases as the temperature of the adsorbent increases. Accordingly, the thermal medium cooled in the exterior heat exchanger 8 is supplied to the adsorption core 6 for cooling the adsorbent.

In the adsorbing mode, the pump 10*a* is operated while the pump 10*d* stops. Therefore, exhaust heat generated from the first heat-generating member 2 is recovered, and the recovered heat is stored in the second reserve tank 12*b*. That is, the thermal medium heated in the first heat-generating member 2 is stored in the second reserve tank 12*b*.

(2) Second Base Operation Mode (Desorbing Mode)

Figure 8:
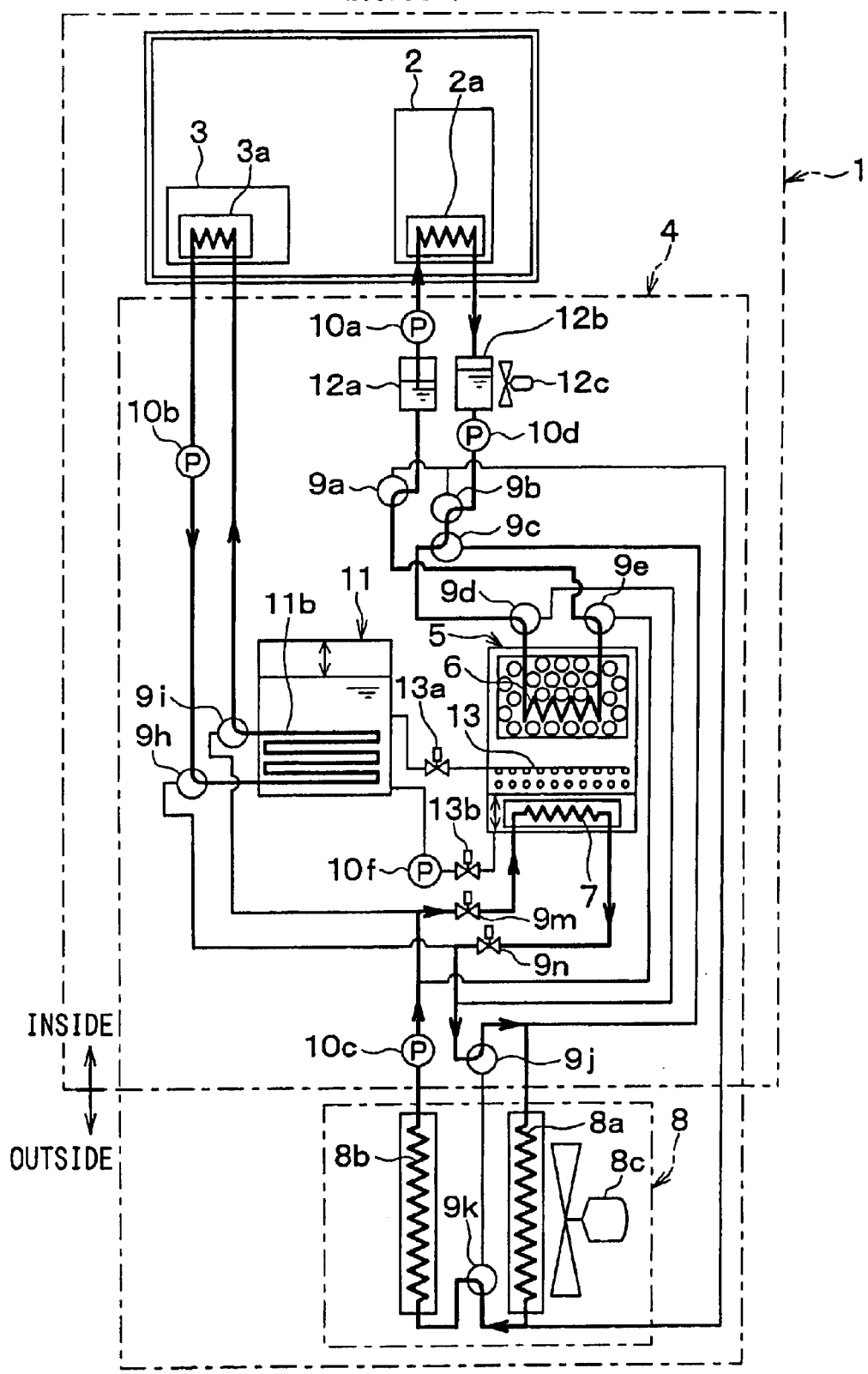
FIG. 8 is a schematic diagram showing a thermal medium flow in the second basis operation mode according to the second embodiment.

In the second base operation mode, as shown in FIG. 8, the thermal medium is circulated between the second heat collection portion 3*a* of the second heat-generating member 3 and the second heat exchanger 11*b* of the cold storage unit 11, so that the second heat-generating member 3 is cooled by the cold stored in the cold storage unit 11. At the same time, the thermal medium in the second reserve tank 12*b* is circulated in the adsorption core 6 so that exhaust heat from the first heat-generating member 2 is applied to the adsorbent of the adsorption core 6. Therefore, refrigerant is removed from the adsorbent, and the removed gas refrigerant from the adsorbent is cooled and condensed by supplying the thermal medium cooled in the exterior heat exchanger 8 to the evaporation/condensation core 7.

Further, the amount of the thermal medium supplied to the adsorption core 6 of the cooling device 4 from the second reserve tank 12*b* is larger than the amount of the thermal medium flowing to the first heat collection portion 2*a* of the first reserve tank 12*a*, so that the amount of the thermal medium in the second reserve tank 12*b* becomes approximately zero when the desorbing mode is finished.

In the second embodiment, the valve 13*b* closes after a predetermined time passes after the pump 10*f* stops. Therefore, almost liquid refrigerant staying in the adsorption unit 5 at a start time of the desorbing mode moves to the cold storage unit 11. After the liquid refrigerant staying in the adsorption unit 5 at the start time of the desorbing mode almost moves to the cold storage unit 11, the valve 13*b* is closed in order to prevent the heated evaporation gas refrigerant separated from the adsorbent from flowing to the cold storage unit 11.

(3) Direct Cooling Mode

The direct cooling mode is performed when the outside air temperature is extremely low in the winter, or when the outside air temperature is lower than a cooling temperature (i.e., permissible heat-resistance temperature of the second heat-generating member 3), or when the cooling device 4 has a trouble.

Figure 9:
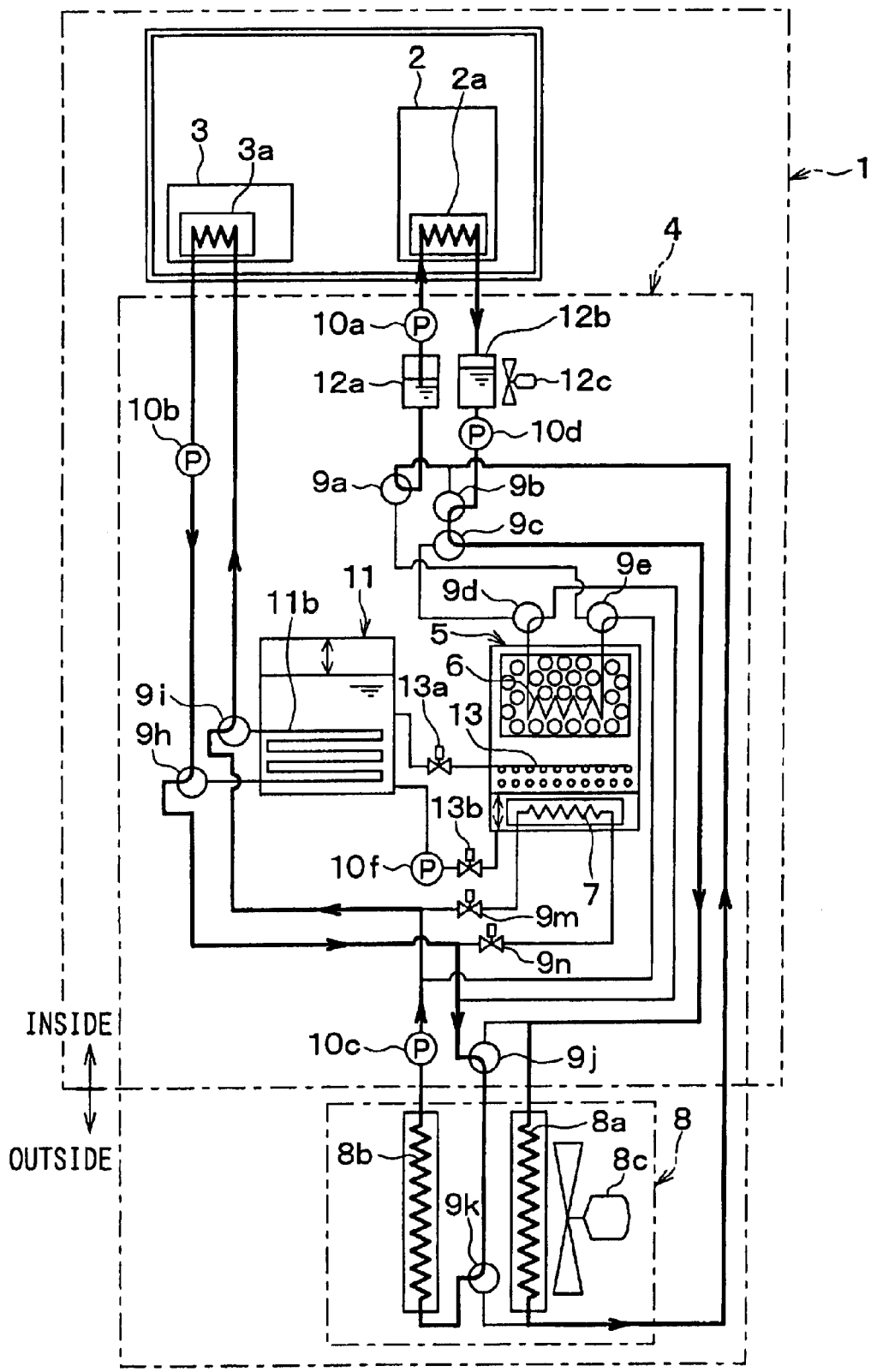
FIG. 9 is a schematic diagram showing a thermal medium flow in the direct cooling mode according to the second embodiment.

Specifically, as shown in FIG. 9, in the direct cooling mode, the thermal medium circulates between the first heat collection portion 2a of the first heat-generating member 2 and the first heat radiation portion 8a, and the thermal medium circulates between the second heat collection portion 3a of the second heat-generating member 3 and the second heat radiation portion 8b. Therefore, heat generated in the first and second heat-generating members 2, 3 is radiated to outside in the outside heat exchanger 8.

In the direct cooling mode, the flow direction of the thermal medium in the pump 10c is the same as that in the base operation mode, in the second embodiment.

(4) Trouble Operation Mode

Figure 10:
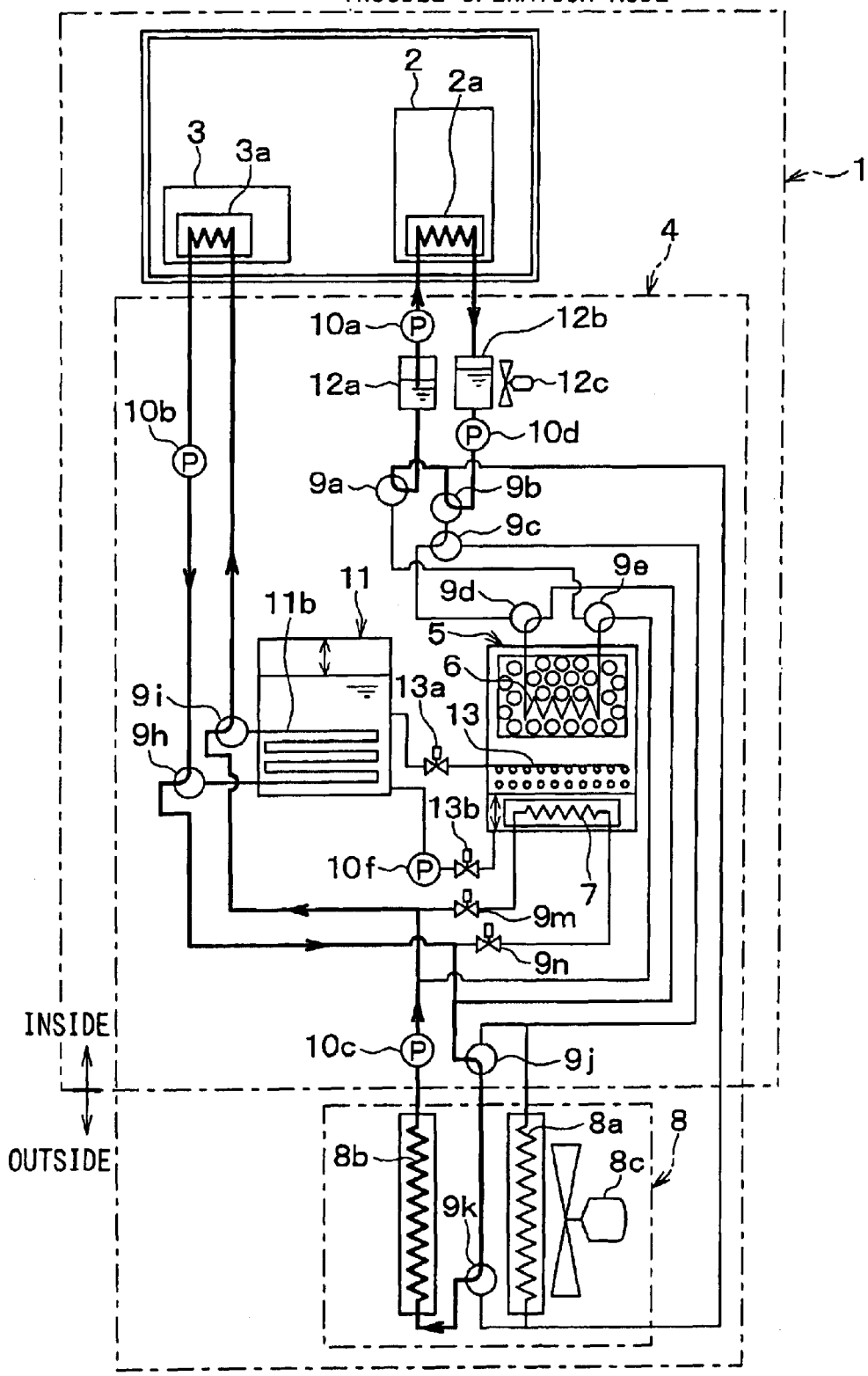
FIG. 10 is a schematic diagram showing a thermal medium flow in the trouble operation mode according to the second embodiment.

The trouble operation mode is performed, when the direct cooling mode cannot be performed while a trouble of the cooling device 4 causes. Specifically, as shown in FIG. 10, in the trouble operation mode, the blower 12c is operated, and the thermal medium is circulated between the first heat collection portion 2a of the first heat-generating member 2, the first reserve tank 12a and the second reserve tank 12b. At the same time, the thermal medium is circulated between the second heat collection portion 3a of the second heat-generating member 3 and the second heat radiation portion 8b of the exterior heat exchanger 8.

According to the second embodiment of the present invention, the cold can be stably supplied to the heat generating body that is the cooling object, and the number of compartments for constructing the cooling system can be reduced, similarly to the above-described first embodiment.

Further, in the second embodiment of the present invention, the liquid refrigerant staying in the adsorption unit 5 at the start time of the desorbing mode is almost moved to the cold storage unit 11, and the refrigerant separated from the adsorbent is condensed by using the whole evaporation/condensation core 7. Therefore, in the desorbing mode, gas refrigerant can be effectively condensed in the evaporation/condensation core 7.

In the above-described second embodiment of the present invention, the valve 13b is switched to be closed, after the predetermined time passes after the pump 10f stops at the stop time of the desorbing mode. However, in the second embodiment, the pump 10f can be operated while the valve 13b is opened, for a predetermined time after the desorbing mode starts, and the valve 13b may be closed simultaneously at the stop time of the pump 10f. In this case, almost the liquid refrigerant staying in the adsorption unit 5 at the start time of the desorbing mode can be moved to the cold storage unit 11 in a short time, and the above-described predetermined time can be shortened.

(Third Embodiment)

Figure 11:
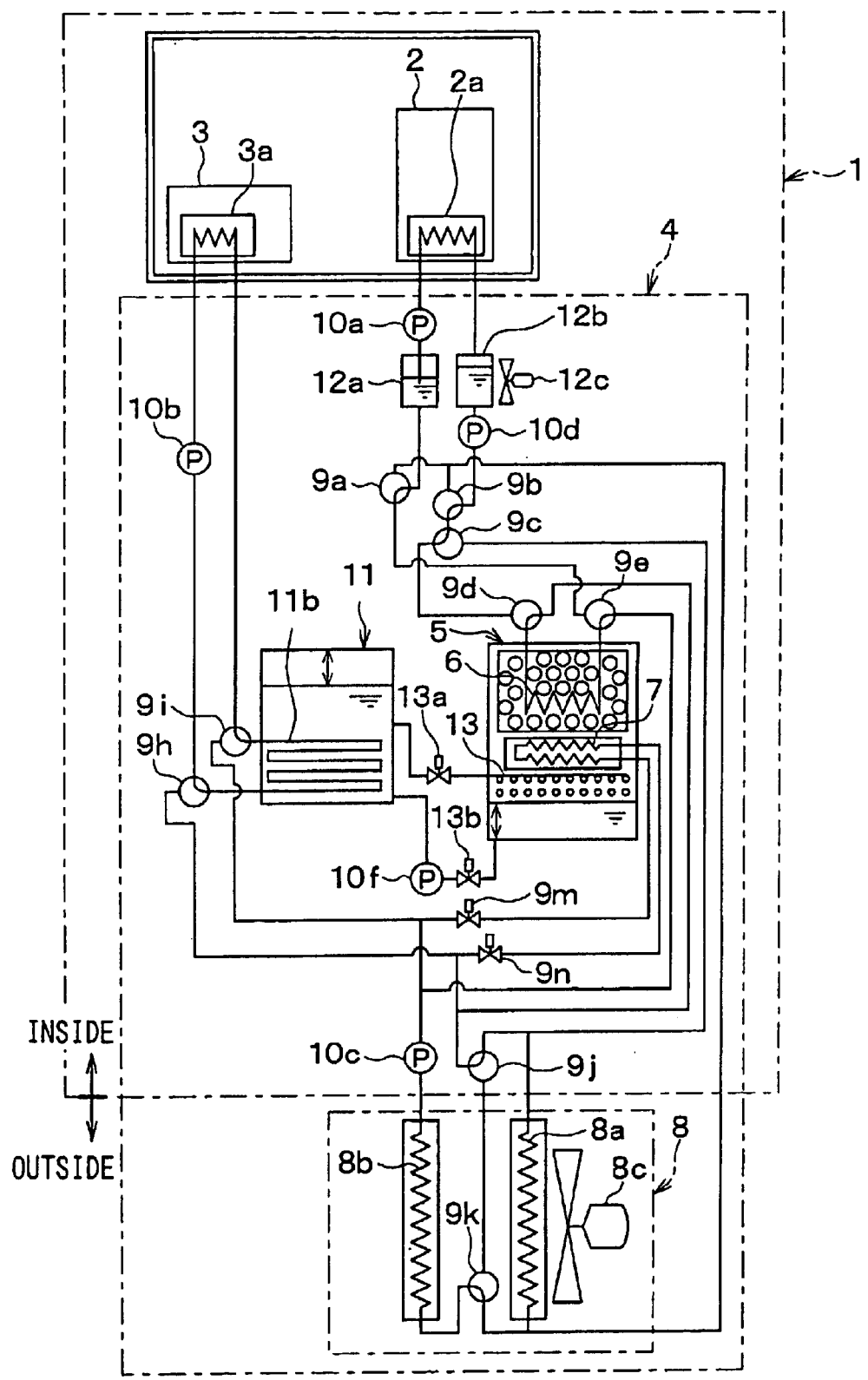
FIG. 11 is a schematic diagram showing a cooling system according to a third embodiment of the present invention.

The third embodiment is a modification of the above-described second embodiment. In the third embodiment, as shown in FIG. 11, the evaporation/condensation core 7 is positioned above the top liquid surface in the adsorption unit 5. Accordingly, the gas refrigerant can be more effectively cooled and condensed in the evaporation/condensation core 7 in the deforming mode, as compared with the above-described second embodiment. Further, in the third embodiment, it can prevent cold generated in the adsorbing mode from being moved to the evaporation/condensation core 7. Therefore, cold can be more effectively stored in the cold storage unit 11.

In the third embodiment, the other parts are similar to those of the above-described second embodiment, and the detail description thereof is omitted.

Although the present invention has been fully described in connection with the preferred embodiments thereof with reference to the accompanying drawings, it is to be noted that various changes and modifications will become apparent to those skilled in the art.

For example, in the above-described embodiments, the present invention is typically applied to the base station of the portable phone. However, the present invention can be used for cooling various-type heat-generating members disposed in a space of a building, a basement, a factory, a shed, a home, a garage or a vehicle. Further, the heat-generating member is a gas turbine engine, a gas engine, a diesel engine, a gasoline engine, a fuel cell, an electronic machine, an electrical machine, an electric converter, an accumulator, an animal including humans or the like. Here, the space is not limited to an entirely closed space, but can be an opened space.

Further, the heat radiation portion of the cooling system (e.g., except for the adsorption unit 5) is not limited to be positioned in air (i.e., atmosphere), but can be positioned in the river, the underground water, the soil, the seawater and the space.

In the above-described embodiments, as the refrigerant, water, alcohol and the like can be used. In the above-described embodiments, the solid adsorbent is used. However, liquid absorbent such as lithium bromide and ammonia immersed in an adsorbing structure may be used as the adsorbent 5.

In the above-described embodiments of the present invention, the exhaust heat discharged from the cooling system can be used for a heater for heating a supply water, a heater for heating air blown into a compartment, or a heater for melting snow or the like Further, in the above-described embodiments of the present invention, the cooling system can be constructed such that, the second heat-generating member 3 can be directly cooled by the cooling device 4 in the adsorbing mode, and can be indirectly cooled by the cold stored in the cold storage unit 11 in the desorbing mode.

Such changes and modifications are to be understood as being within the scope of the present invention as defined by the appended claims.

What is claimed is:

1. A cooling system for cooling first and second heat-generating members disposed in a closed space, the first and second heat-generating members generate heat while being operated, the cooling system comprising:

a refrigerator that is disposed to absorb heat from the first and second heat-generating members and is operated using the absorbed heat; and a cold storage unit that stores cold produced in the refrigerator.

2. The cooling system according to claim 1, wherein:

the refrigerator includes an adsorption unit having an adsorbent for adsorbing gas refrigerant, the refrigerant adsorbed in the adsorbent being removed from the adsorbent when being heated;

the adsorption unit is disposed to alternately repeat an adsorbing mode where the adsorbent adsorbs gas refrigerant to obtain cooling capacity, and a desorbing mode where the adsorbed refrigerant is removed from the adsorbent; and the cold storage unit is disposed to cool the second heat-generating member in both the adsorbing mode and the desorbing mode.

3. The cooling system according to claim 2, wherein:
in the adsorbing mode, liquid refrigerant in the adsorption unit is supplied to the cold storage unit, and the cold storage unit stores the cold by liquid refrigerant supplied from the adsorption unit.

4. The cooling system according to claim 3, further comprising
a condenser, disposed in the adsorption unit, for cooling and condensing refrigerant removed from the adsorbent in the desorbing mode, wherein:
liquid refrigerant within the adsorption unit is supplied to the cold storage unit for a predetermined time after a start of the deforming mode, so that a liquid surface in the adsorption unit is decreased.

5. The cooling system according to claim 3, further comprising
a condenser, disposed in the adsorption unit, for cooling and condensing refrigerant removed from the adsorbent in the desorbing mode, wherein:
the condenser is disposed at a position higher than a liquid surface in the adsorption unit.

6. The cooling system according to claim 1, further comprising
first and second tanks that are disposed to store a fluid through which heat absorbed from the first heat-generating member supplies to the refrigerator, wherein:
the first and second tanks are arranged such that the fluid before being heated in the first heat-generating member is stored in the first tank, and the fluid after being heated in the first heat-generating member is stored in the second tank; and
in a fluid circulation mode, a flow amount of the fluid supplied from the second tank to the refrigerator is made larger than that of the fluid supplied from the first tank to the first heat-generating member.

7. The cooling system according to claim 6, further comprising:
a first pump that controls the flow amount of the fluid flowing from the first tank; and
a second pump that controls the flow amount of the fluid flowing from the second tank.

8. The cooling system according to claim 6, further comprising
a facilitating member for facilitating heat exchange between the fluid in the second tank and air.

9. The cooling system according to claim 1, further comprising
first and second tanks that are disposed to store a fluid through which heat absorbed from the first heat-generating member supplies to the refrigerator, wherein:
the first and second tanks are arranged such that the fluid before being heated in the first heat-generating member is stored in the first tank, and the fluid after being heated in the first heat-generating member is stored in the second tank; and
at least in the desorbing mode, a flow amount of the fluid supplied from the second tank to the refrigerator is made larger than that of the fluid supplied from the first tank to the first heat-generating member.

10. The cooling system according to claim 9, further comprising:
a first pump that controls the flow amount of the fluid flowing from the first tank; and
a second pump that controls the flow amount of the fluid flowing from the second tank.

11. The cooling system according to claim 9, further comprising
a facilitating member for facilitating heat exchange between the fluid in the second tank and air.

12. The cooling system according to claim 1, wherein:
the refrigerator includes an adsorption unit for performing heat exchange of a refrigerant, wherein:
the adsorption unit includes an adsorption core having therein an adsorbent that has a refrigerant-adsorbing capacity decreasing as temperature of the adsorbent decreases, and a condensation core for condensing the refrigerant removed from the adsorbent;
the adsorption unit is disposed to alternatively repeat an adsorbing mode where the adsorbent adsorbs gas refrigerant to obtain a cooling capacity, and a desorbing mode where the adsorbed refrigerant is removed from the adsorbent and is condensed in the condensation core; and
the cold storage unit is coupled to the condensation core of the adsorption unit such that cold produced in refrigerant condensation in the condensation core is stored in the cold storage unit.

13. The cooling system according to claim 12, further comprising
a heat exchanger for cooling the adsorbent in the adsorption core in the adsorbing mode.

14. The cooling system according to claim 12, wherein:
in the adsorbing mode, liquid refrigerant in the adsorption unit is supplied to the cold storage unit, and the cold storage unit stores the liquid refrigerant supplied from the adsorption unit.

15. The cooling system according to claim 12, wherein:
the cold storage unit is disposed to cool the second heat-generating member in both the adsorbing mode and desorbing mode.

16. The cooling system according to claim 15, further comprising
first and second tanks that are disposed to store a fluid through which heat absorbed from the first heat-generating member supplies to the adsorption unit, wherein:
the first and second tanks are arranged such that the fluid before being heated in the first heat-generating member is stored in the first tank, and the fluid after being heated in the first heat-generating member is stored in the second tank.

17. The cooling system according to claim 16, wherein:
at least in the desorbing mode, a flow amount of the fluid supplied from the second tank to the adsorption unit is made larger than that of the fluid supplied from the first tank to the first heat-generating member.

18. The cooling system according to claim 16, wherein:
the adsorption unit is coupled to the first and second tanks such that the fluid flows between the adsorption unit and the first and second tanks.

* * * * *